| United States Patent [19] | [11] Patent Number: 5,016,067 |
| Mori | [45] Date of Patent: * May 14, 1991 |

[54] VERTICAL MOS TRANSISTOR

[75] Inventor: Kiyoshi Mori, Stafford, Tex.

[73] Assignee: Texas Instruments Incorporated, Dallas, Tex.

[ * ] Notice: The portion of the term of this patent subsequent to May 14, 2008 has been disclaimed.

[21] Appl. No.: 449,124

[22] Filed: Dec. 8, 1989

Related U.S. Application Data

[63] Continuation of Ser. No. 180,424, Apr. 11, 1988, abandoned, which is a continuation of Ser. No. 921,728, Oct. 21, 1986, abandoned.

[51] Int. Cl.$^5$ .............................................. H01L 29/78
[52] U.S. Cl. .................................................. 357/23.4
[58] Field of Search ..................... 357/23.4, 23.6, 23.1, 357/55, 23.8

[56] References Cited

U.S. PATENT DOCUMENTS

| 3,518,509 | 6/1970 | Cullis | 357/23.4 |
| 4,334,235 | 6/1982 | Nishizawa | 357/55 |
| 4,707,721 | 11/1987 | Ang et al. | 357/23.4 |

FOREIGN PATENT DOCUMENTS

| 0956188 | 3/1975 | Canada | 357/23.4 |
| 2003068 | 11/1969 | France | 357/23.4 |
| 56-29362 | 3/1981 | Japan | 357/23.4 |
| 61-142774 | 6/1986 | Japan | 357/23.4 |

OTHER PUBLICATIONS

Ammar et al, IEEE Transactions on Electron Devices, vol. ED27, No. 5, May 1980, pp. 907–914.
Rodgers et al., IEEE Journal of Solid State Circuits, vol. SC12, No. 5, Oct. 1977, pp. 515–524.
Magdo et al., IBM Tech. Discl. Bulletin, vol. 14, No. 3, Aug. 1971, p. 751.
IBM Tech. Discl. Bul., vol. 14, No. 3, Aug. 1971, p. 751, "High-Speed Epitaxial Field Effect Devices", Magdo et al.

Primary Examiner—William D. Larkins
Attorney, Agent, or Firm—Theodore D. Lindgren; Thomas W. DeMond; Melvin Sharp

[57] ABSTRACT

A transistor structure is disclosed which has a vertical channel which has its length controllable by currently-used diffusion processes, and which occupies a minimum of silicon surface area. The transistor is constructed by using a triple-level implant and diffusion process. The drain region is diffused into the silicon area by way of ion implantation and subsequent diffusion. The channel region, of opposite conductivity-type from the drain region, is implanted and diffused into the drain region. The source region is similarly implanted, and diffused into the channel region. A trench is etched into the silicon, extending through the source, channel and drain regions; gate oxide is grown in the trench and a polysilicon gate is deposited in the trench, conformal with the gate oxide. Transistor action takes place in the channel region along the walls of the trench, dependent upon the voltage applied to the gate electrode. Series drain resistance, and gate-to-drain capacitance, is minimized by a deeper implant of the drain region away from the trench and under the electrical interconnection to the drain diffusion.

6 Claims, 5 Drawing Sheets

VERTICAL MOS TRANSISTOR

This is a continuation of Ser. No. 07/180,424 filed Apr. 11, 1988, now abandoned, which was a continuation of Ser. No. 06/921,728 filed Oct. 21, 1986, now abandoned.

This invention is related to my U.S. patent application Ser. No. 07/449,135, entitled "Vertical Floating-Gate Transistor", filed Dec. 12, 1989, which is a continuation of U.S. patent application Ser. No. 07/181,789, filed Apr. 15, 1988. This application is also related to my U.S. patent application Ser. No. 07/485,806, entitled "Symmetric Vertical MOS Transistor with Improved High Voltage Operation", filed Feb. 23, 1990, which is a continuation of U.S. patent application Ser. No. 07/135,489, filed Dec. 21, 1987, which is a continuation of U.S. patent application Ser. No. 06/921,727, filed Oct. 21, 1986. The related applications are also assigned to Texas Instruments Incorporated.

BACKGROUND OF THE INVENTION

This invention relates to semiconductor transistors, and specifically to insulated-gate field-effect transistors, such as metal-oxide-semiconductor (MOS) transistors.

Electronic devices ranging from discrete transistors to VLSI (Very Large Scale Integration) circuits have been improved in cost and performance in many ways over the past years. One of these ways is by reducing the size of the circuit elements used. A basic circuit element is the transistor, and in the more advanced and higher density circuits, the insulated-gate field-effect transistor (IGFET). Current technology primarily uses silicon as the semiconductor and silicon-oxide as the insulator in such transistors; the resultant transistor is thus commonly called the metal-oxide-semiconductor field-effect transistor, or MOSFET. Therefore, the smaller the MOSFET that can be fabricated, the more MOSFETs that can occupy a give surface area on a silicon slice, in turn allowing the manufacture of more complex and powerful VLSI circuits at reduced cost.

Limitations in the reduction in the size of the MOSFET often exist at the dimension of the channel length of the transistor. The channel is the area between the source and drain of a MOSFET which, in digital applications, is selectively made non-conductive and conductive to effect the desired digital operation. A well defined channel is therefore essential in fabricating a functional semiconductor device. However, as the desired channel length becomes increasingly smaller, small manufacturing errors, or small particulate contaminants, can more easily cause the channel to be permanently short-circuited, rendering the transistor and the VLSI device non-functional.

In addition, as is well known in the art, the channel length controls important electrical characteristics of the device. One of these characteristics is the value of the dependence on source-to-drain current on the gate voltage, commonly called the transconductance of the device. The switching speed of the transistor increases as the transconductance of the device increases. In order to fabricate an integrated circuit having the desired electrical behavior, the transconductance of the individual transistors within the integrated circuit must be well-controlled. This requires that the channel length of the MOS transistors in such devices must be well controlled.

It is therefore desirable that MOSFETs having very small yet controllable channel lengths be incorporated into VLSI circuit designs. Heretofore, the minimum channel lengths that have been controllable have been on the order of one micron (micrometer). Current methods, primarily photolithographic in nature, have precluded substantial manufacture of smaller transistors, since it is difficult for current equipment to print patterns of smaller than one micron, with tolerances better than 20%. If channel lengths vary by 20% within a device, or from device to device, the electrical performance of the circuits will be less than desired.

It is therefore an object of this invention to provide an MOS transistor structure having a short channel length which can be fabricated by a method allowing for a high degree of channel length control.

It is a further object of this invention to provide an MOS transistor structure having a well-controlled channel length, and which minimizes gate-to-drain capacitance.

It is a further object of this invention to provide an MOS transistor structure having a sub-micron channel length and which occupies small silicon surface area.

It is a further object of this invention to provide a method for fabricating such an MOS transistor structure.

Other objects and advantages of the invention will become apparent to those skilled in the art, having reference to the specification and the drawings below.

SUMMARY OF THE INVENTION

The invention may be incorporated in an MOS field-effect transistor in which the gate oxide is deposited in a trench, and where the channel is fabricated in a vertical direction along the sides of the trench. The source, channel and drain regions are formed by means of three diffusions into a substrate, with the drain region being the deepest of the three, the channel being the next deepest and being of the opposite conductivity-type from the source and drain, and the source region being the shallowest diffusion. By means of an electrode conformally placed adjacent to the gate oxide in the trench, the presence or absence of a conductive channel from source to drain, along the side of the trench, can be controlled. The deepest diffusion, i.e., the drain, is fabricated in such a manner that it is deeper in a region spaced away from the trench under its electrode, so that the drain resistance and the gate-to-drain capacitance are minimized. An electrode may be connected to the channel diffusion, for external control of the threshold voltage of the device.

DETAILED DESCRIPTION OF THE PREFERRED EMBODIMENT

Various techniques have been proposed in the prior art for fabricating metal-oxide-semiconductor field-effect transistors (MOSFETs) which have a channel length of less than one micron. These techniques have had the disadvantages of being difficult to consistently fabricate to the required tolerances of VLSI circuits, of being very expensive or complex to process, or both. The failure of these techniques to repeatedly and economically produce such transistors is addressed by the invention described herein.

Figure 1A:
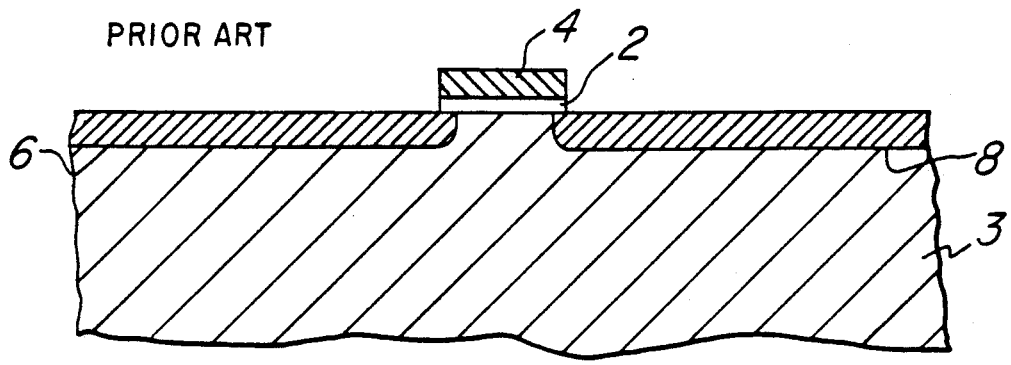
FIGS. 1a, 1b and 1c are cross-sectional views of short channel length transistor structures according to the prior art.

Referring to FIG. 1a, a cross-sectional view of an MOS transistor, fabricated by well-known photolithographic techniques, is shown. Gate oxide 2, which is a thin film of silicon dioxide, silicon nitride, or other dielectric material, is grown on selected areas of the surface of silicon substrate 3 to serve as the insulating dielectric of the MOSFET. A layer of polysilicon 4 is deposited upon the entire surface of substrate 3, to serve as the gate electrode, and is patterned and etched to the desired width (in this case, approximately 0.5 micron). Subsequent to this patterning and etching, a dopant such as phosphorous or arsenic (for n-type doping) or boron (for p-type doping) is deposited and diffused to create source region 6 and drain region 8. In the example of FIG. 1a, the designation of source region 6 and drain region 8 relative to one another is arbitrary. FIG. 1a shows in schematic form the source, drain and gate connections to source region 6, drain region 8 and gate electrode 4, respectively.

In operation, the MOS transistor of FIG. 1a operates such that the conductivity between source region 6 and drain region 8 is dependent on the presence and extent of a conductive channel under polysilicon gate 4, which is dependent upon the voltage of polysilicon gate 4, which is dependent upon the voltage of polysilicon gate 4 relative to source region 6, as is well known in the art. Assuming that substrate 3 is p-type, and that source region 6 and drain region 8 are n-type, a positive potential applied to polysilicon gate 4 relative to source region 6 will tend to invert the p-type region between source region 6 and drain region 8 because of the electric field across gate oxide 2; at the point of "strong" inversion of this region (at which the voltage of polysilicon gate 4 relative to source region 6 is defined to be at its threshold voltage), current will be conducted from drain region 8 to source region 6 if a positive potential is applied to drain region 8 relative to source region 6. In modern integrated circuits, the transistor of FIG. 1a is of the enhancement-mode type, meaning that with a zero voltage difference between polysilicon gate 4 and source region 6 (drain region 8 having a positive bias relative to source region 6), no conductive channel exists under polysilicon gate 4 from source region 6 to drain region 8 (i.e., the threshold voltage is greater than zero).

Undesired variability in the performance of transistor of FIG. 1a will increase, however, as the channel length of the transistor decreases. For example, current photolithographic technology limits the minimum gate width to approximately 0.5 micron, as patterned. Variance in the polysilicon etch process can cause the width of polysilicon gate 4 to vary significantly (on the order of 0.1 micron, or 20% of the intended gate width). In addition, as is evident from FIG. 1a, source region 6 and drain region 8 are diffused regions having lateral diffusion under polysilicon gate 4; therefore, variances in the diffusion process can cause variances in the lateral diffusion, resulting in further variations in channel length between source region 6 and drain region 8. It should also be noted from FIG. 1a that the surface area occupied by the transistor is directly related to the channel length, as the entire channel length is at the surface of substrate 3. For these reasons, both the ability of a manufacturing facility to consistently manufacture a transistor according to FIG. 1a which has sub-micron channel lengths, and also the capability of reducing the surface area of an integrated circuit using the transistor of FIG. 1a, are necessarily limited.

Figure 1B:
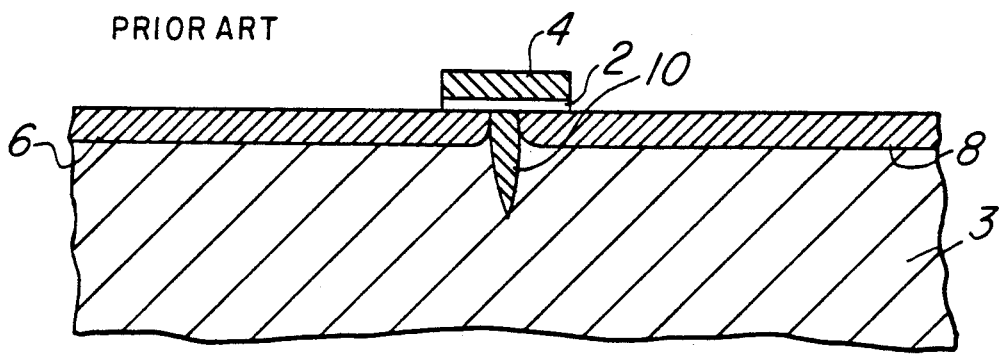

Referring now to FIG. 1b, a prior art MOS transistor is shown which attempts to alleviate some of these inherent problems of the transistor in FIG. 1a. The MOS transistor of FIG. 1b is substantially similar to the MOS transistor of FIG. 1a, except that heavily-doped region 10 is present under gate oxide 2 and polysilicon gate 4. Heavily-doped region 10 is created prior to the growth of gate oxide 2, by implanting substrate 3 with an ion beam of a dopant opposite in conductivity-type from the dopant used for source region 6 and drain region 8. For example, if the transistor of FIG. 1b is to be n-channel, substrate 3 is p-type, source region 6 and drain region 8 are n-type, and heavily-doped region 10 is therefore p-type and is created by a beam of boron ions. After additional diffusion during the growth of gate oxide 2 or via a separate drive-in-diffusion step, p+region 10 will extend into the substrate to the desired depth. Polysilicon 4 is then deposited, patterned and etched as discussed above. The presence of p+region 10 allows polysilicon gate 4 to be wider than the actual channel, as the channel length is not dependent upon the width of polysilicon gate 4 but is instead dependent upon the width of p+region 10. Phosphorous or arsenic is then deposited and diffused to form source region 6 and drain region 8, with the lateral diffusion being of little impact since p+region 10 defines the channel. It should be noted that the impurity concentration for p+region 10 is at least 100 times that of source region 6 and drain region 8, so that even if n-type impurities are diffused into p+region 10, the concentration of such n-type impurities is insignificant relative to the concentration of p-type impurities in p+region 10. As a result, a short channel MOS transistor can be formed which is not dependent upon the accuracy of the patterning of polysilicon gate 4, but in order to do this, an additional ion implant step is required, which is a costly step in the manufacture of semiconductor devices. In addition, the surface area occupied by such a device is relatively large, since polysilicon gate 4 is still patterned to at least 0.5 micron wide, similarly to the transistor of FIG. 1a. The electrical characteristics of the device of FIG. 1b are also impacted by the overlap of polysilicon gate 4 over source region 6 and drain region 8, since such overlap, having gate oxide 2 therebetween, establishes significant gate-to-source and gate-to-drain capacitance, degrading the switching characteristics of the device.

Figure 1C:
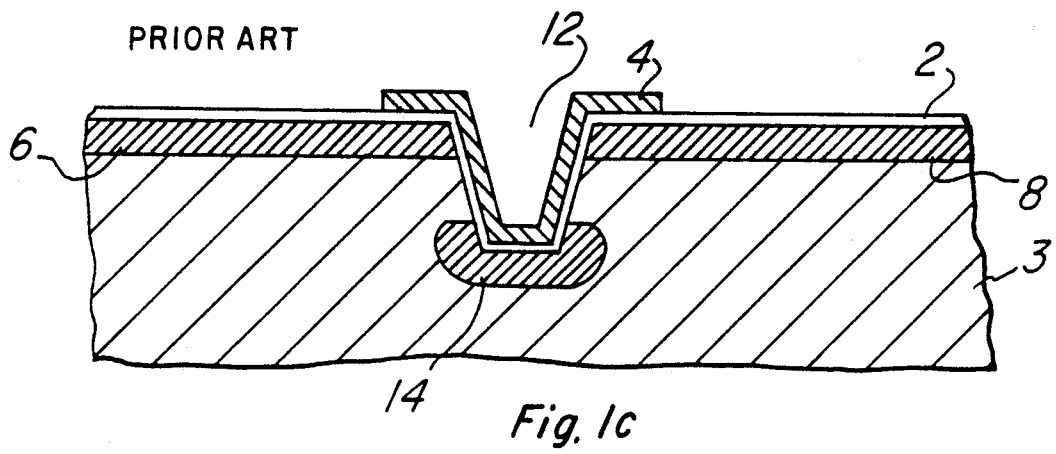

FIG. 1c illustrates another sub-micron channel length MOS transistor structure according to the prior art. In this transistor, a trench 12 is patterned and etched into the body of substrate 3. Phosphorous-doped silicon is deposited on the bottom of trench 12 (for an n-channel transistor, although boron or another Group III dopant would be used for a p-channel transistor), by means of chemical vapor deposition, preferably a Low Pressure Chemical Vapor Deposition (LPCVD) method. After the silicon is subjected to a high temperature environment for a period of time, the phosphorous dopant will diffuse into the surrounding region, leaving conductive layer 14 diffused into the silicon at the bottom of the trench. The n-channel diffusions forming source region 6 and drain region 8 are also made by means of the same LPCVD process which forms conductive layer 14 at the bottom of the trench, or may be made by a standard diffusion prior to the patterning and etching of trench 12. Gate oxide 2 and polysilicon gate 4 are grown and deposited, respectively, after source region 6 and drain region 8 are present in substrate 3. The transistor operates dependent upon the voltage applied to polysilicon gate 4, similar to the transistors discussed above relative to FIGS. 1a and 1b; as the potential of polysilicon gate 4 causes inversion of the p-type regions between source region 6 and conductive layer 14, and between drain region 8 and conductive region 14, current can flow from drain region 8 to source region 6. While the transistor of FIG. 1c can be fabricated to occupy a smaller surface area than its channel length, a portion of the channel length being directed at an angle to the face of substrate 3, the channel length of the transistor still exceeds one micron, which tends to negate some of the transconductance (and therefore switching speed) advantages of a transistor having a channel length less than one micron. In addition, it should be noted that significant overlap of polysilicon gate 4 over n-type areas (source region 6, drain region 8 and conductive layer 14) is present in the transistor of FIG. 1c; this creates significant parasitic capacitances acting as a load to the transistor. These capacitances cannot be reduced merely by adjusting the width of polysilicon gate 4, but must instead be reduced by varying the diffusion depths of source region 6 and drain region 8 to reduce the gate-to-source and gate-to-drain overlap. However, the channel length will vary with the diffusion depths unless the depth of trench 12 is reduced accordingly. Regardless of the change in diffusion depths of source region 6 and drain region 8, the overlap of polysilicon gate 4 to conductive layer 14 cannot be easily minimized. Finally, the LPCVD process which is required to properly create conductive layer 14 is quite costly, relative to a process not utilizing such technology.

Figure 2:
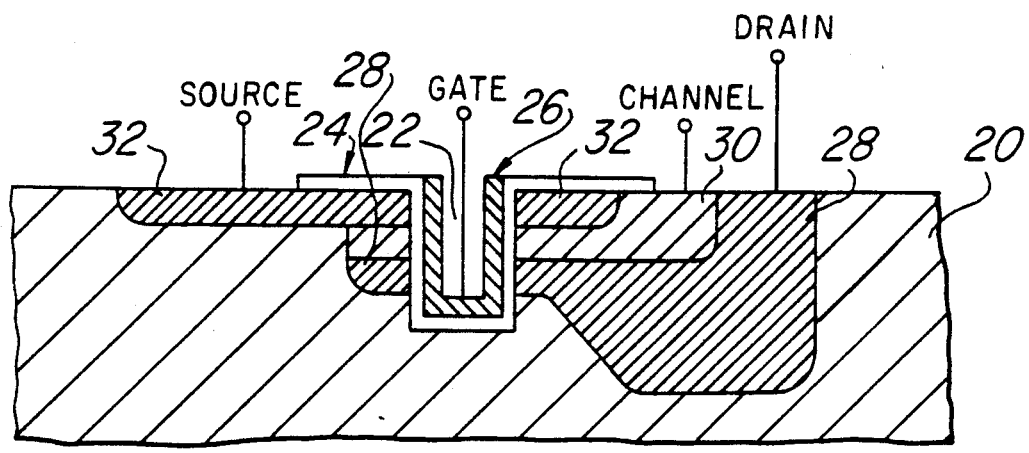
FIG. 2 is a cross-sectional view of a short channel length transistor according to the preferred embodiment of the invention.

Referring now to FIG. 2, a cross-sectional view of a transistor according to the invention is illustrated, and the components of the transistor will be described in detail. By way of example, the transistor of FIG. 2 is an n-channel transistor, it being understood that the construction described herein is equally applicable to p-channel transistors. Substrate layer 20 is single-crystal silicon, having <100> orientation, and is doped to be lightly p-type. Etched into substrate layer 20 is a trench 22, being of substantially rectangular cross-sectional shape. A layer of silicon dioxide, shown in FIG. 2 as gate oxide 24, is conformal with trench 22, and will serve as the gate dielectric; it is understood that while gate oxide 24 in this embodiment is described as silicon dioxide, other dielectric material, such as silicon nitride, may be used to serve the same purpose. Gate electrode 26 conforms to gate oxide 24, and is of a conductive material, preferably polycrystalline silicon. Drain region 28 is a phosphorous-doped region (n-type) extending to the surface of substrate 20 and to a predetermined depth in the area of trench 22. Channel region 30 is a boron-doped region (p-type) which similarly extends to the surface of substrate 20, but which, in the area of trench 22, is shallower than drain region 28. Source region 32 is an arsenic-doped region which also extends to the surface of substrate 20, but which, in the area of trench 22, is shallower than channel region 30.

Electrical connection to source region 32, drain region 28 and gate electrode 26 is schematically shown in FIG. 2; physical connection to these portions of the transistor may of course be made by any of the well-known methods for contacting regions within a semiconductor chip. In operation, a positive voltage is applied to drain region 28 relative to source region 32. The voltage of gate electrode 26 is selectively controlled to control the conductivity of channel region 30 between drain region 28 and source region 32, along the sides of trench 22. FIG. 2 in effect shows the transistor in the condition where the voltage applied to gate electrode 26 is significantly less than the voltage of drain region 28 plus the threshold voltage of the transistor, i.e., the channel between drain region 28 and source region 32 is not conductive. It should be noted that, depending upon such factors as the charge trapped at the interface between substrate 20 and gate oxide 24, and between gate electrode 26 and gate oxide 24, as well as the dopant concentration in channel region 30, the threshold voltage of the transistor may be less than zero; in such a case, of course, the voltage of gate electrode 26 will be negative relative to source region 32 in order to effect the off condition. In such a condition, the portion of channel region 30 adjacent to gate oxide 24 on all sides of trench 22 is still p-type, i.e., the majority charge carriers in said portion of channel region 30 are holes rather than electrons. As a result, reverse-biased p-n junctions are present between drain region 28 and channel region 30, and also between source region 32 and channel region 30, preventing current flow from drain region 28 to source region 32.

Figure 3:
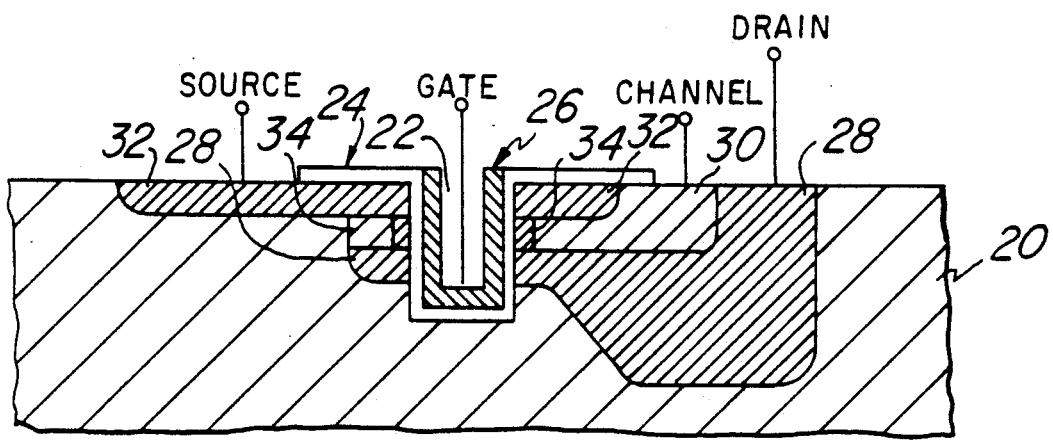
FIG. 3 is a cross-sectional view of the transistor of FIG. 2, showing said transistor in the saturation condition.

Referring now to FIG. 3, the condition of the transistor of FIG. 2 is shown with the voltage applied to gate electrode 26 being greater than the voltage of source region 32 by more than the threshold voltage of the transistor, and with a positive voltage applied to drain region 28 relative to source region 32. The positive voltage on gate electrode 26 relative to source region 32 has the effect of attracting free electrons from n-type source region 32 into channel region 30. If the voltage of gate electrode 26 is sufficiently high, the free electrons attracted into channel region 30 will exceed the number of holes provided by the boron dopant in channel region 30, so that electrons, rather than holes, are the majority charge carriers in these portions of channel region 30. Those areas within channel region 30 which have been inverted from p-type to n-type are shown in FIG. 3 as inversion regions 34. Inversion regions 34 are of course adjacent to gate oxide 24, i.e., at the point of the strongest electric field. The transistor threshold voltage is defined as the value of the differential voltage between gate electrode 26 and source region 32 at which inversion regions 34 completely extend from drain region 28 to source region 32. Therefore, when the gate-to-source voltage exceeds the threshold voltage as shown in FIG. 3, the p-n junctions which inhibited current flow from drain region 28 to source region 32 are no longer present, and current can now flow from drain region 28 to source region 32, through inversion regions 34. The transistor action occurs since the voltage applied to gate electrode 26 controls the conduction of current between drain region 28 and source region 32.

As is well known in the art, if a voltage is applied to the portion of an MOS transistor into which inversion regions 34 are to be formed, the threshold voltage can be modulated. Accordingly, a voltage applied to channel region 30 via the electrode schematically illustrated in FIGS. 2 and 3, will affect the value of the threshold voltage of the transistor. Physical contact to channel region 30 may either be made from the surface as suggested by FIGS. 2 and 3, or by contact to substrate 20. For the n-channel transistor illustrated in FIGS. 2 and 3, if a voltage is applied to channel region 30 which is negative relative to source region 32, the threshold voltage of the transistor will increase.

The transistor of FIG. 2, constructed according to the invention, has several features which provide significant advantages over the prior art. First of all, the channel length of the transistor of FIG. 2 is determined by the depth of p-type channel region 30, which can be controlled to depths as shallow as 0.15 micron by diffusion processes well-known in the art. By allowing control of the MOS transistor channel length by means of a diffusion, photolithograhic processes are no longer relied upon in defining sub-micron channel lengths, allowing shorter channel lengths with better control. In addition, lateral diffusion does not affect the channel length dimension, and thereby does not affect the electrical characteristics of the transistor, but only affects the layout of the device in non-critical areas away from the transistor channel. Furthermore, since the channel is vertical, the amount of chip surface area required for the transistor of FIG. 2 is not dependent upon its channel length, but is instead is defined by the area required to electrically connect to drain region 28, gate electrode 26 and source region 32. These connections are of course required for any transistor, including the planar transistors of the prior art. The transistor of FIG. 2 therefore inherently requires less surface area to accomplish the same function as transistors in the prior art.

The shape of drain region 28 shown in FIG. 2 allows further important electrical advantages. It should be noted that gate electrode 26 overlaps drain region 28 only within the trench, and only for the depth of drain region 28 which extends beyond channel region 30. This depth can be limited to approximately 0.30 micron, utilizing the method described hereinbelow. The area of gate-to-drain overlap is important from the standpoint of electrical characteristics of the transistor, since the gate-to-drain capacitance is directly proportional to this overlap. The gate-to-drain capacitance affects such parameters as the value of the highest frequency at which the effective gain of the transistor remains constant; as the gate-to-drain capacitance increases, the switching speed decreases. The gate-to-drain capacitance has an especially important effect, since the increase in the effective small-signal capacitance (i.e., the Miller capacitance) a multiple of an increase of the gate-to-drain capacitance. Similarly, the overlap of gate electrode 26 over source region 32 can be reduced to approximately 0.25 micron in the transistor described herein, allowing a reduced gate-to-source capacitance over planar and other transistors in the prior art. As is well known, an increase in gate-to-source capacitance causes a slower switching time (the gate-to-source capacitance necessarily being charged by the gate potential before the gate potential can have an effect upon channel region 30); in analog applications of the transistor, the gate-to-source capacitance also affects the value of the highest frequency at which the effective gain of the transistor remains constant. The transistor constructed according to the invention allows existing technology to economically construct a sub-micron channel length transistor having minimal gate-to-source and gate-to-drain overlap and capacitance.

FIG. 2 shows that drain region 28 extends deeper into substrate 20 at a distance away from trench 22. This feature reduces the series drain resistance of the transistor. Since the resistance of a material is inversely proportional to its cross-sectional area, by increasing the cross-sectional area of a conductive region, such as drain region 28, the resistance it presents to the circuit is reduced. If drain region 28 were made deeper over its entire length, however, including the point adjacent to trench 22, the gate-to-drain capacitance would be increased as discussed above. In order to minimize both the gate-to-drain capacitance and the drain resistance, drain region 28 is fabricated so that it is shallow at trench 22, but deeper at a distance away from trench 22, under its electrical contact. As will be explained hereinbelow, this feature requires the addition of an ion implant step.

Figure 4A:
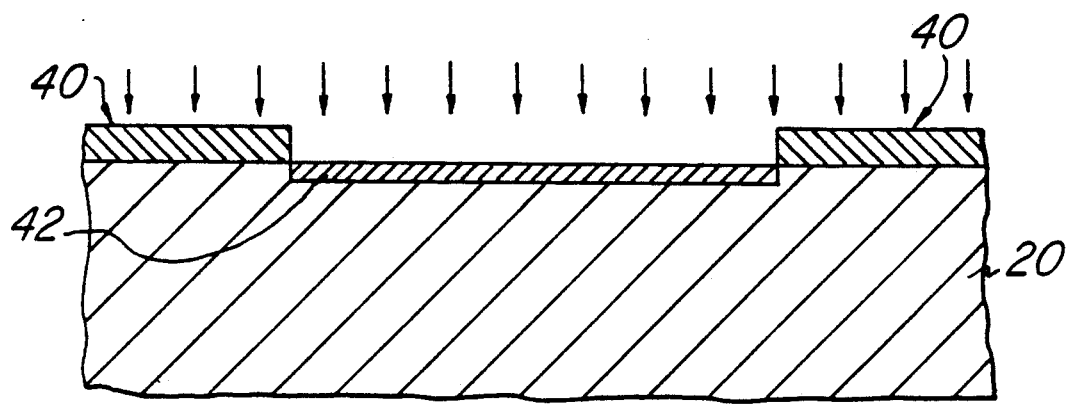
FIGS. 4a through 4h are cross-sectional views of the transistor of FIG. 2, illustrative of the steps used in fabricating said transistor.

Referring now to FIGS. 4a through 4h, the preferred method for constructing the transistor of FIG. 2 will be described. FIG. 4a is a cross-sectional view of substrate 20, showing masking layer 40 which is defining the area of drain region 28. As discussed above, substrate 20 is preferably single crystal silicon, having <100> orientation, and being lightly doped p-type material. Masking layer 40 is fabricated by methods well known in the art for providing a mask for ion implantation, such that only selected areas of a silicon substrate are implanted with the ions from the ion beam. For example, a layer of photoresist which will provide a masking film if exposed to light and developed is spun onto substrate 20. A photomask which is opaque in the areas which are to be implanted, and transparent in the areas which are to be shielded from the implantation, is then placed adjacent to substrate 20, and the surface of substrate 20 is exposed to high intensity light. The photomask is removed, the photoresist developed, and the unexposed photoresist is removed from substrate 20, leaving a developed photoresist layer on substrate 20 over those areas which are to be shielded from ion implantation. Alternatively, a photoresist which provides a masking film if developed but not exposed to light may be used with a photomask which is opaque in the areas which are to be shielded from the implantation and transparent in the areas which are to be implanted. The end result of either technique is the presence of masking layer 40, as shown in FIG. 4a, which will prevent energized ions from reaching substrate 20 in the areas it covers. FIG. 4a shows substrate 20 exposed to a beam of energized phosphorous ions (represented by the arrows). A typical dose is 4E11 ions/cm$^3$, at an energy of 40 keV, which can be provided by existing implantation equipment using methods well known in the art. Doped layer 42, a region near the surface of substrate 20 doped with phosphorous ions, results from the ion implantation.

Figure 4B:
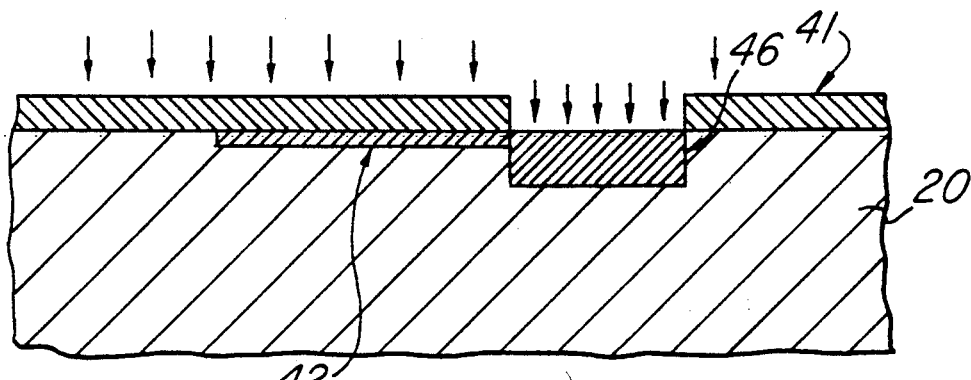
Figure 4C:
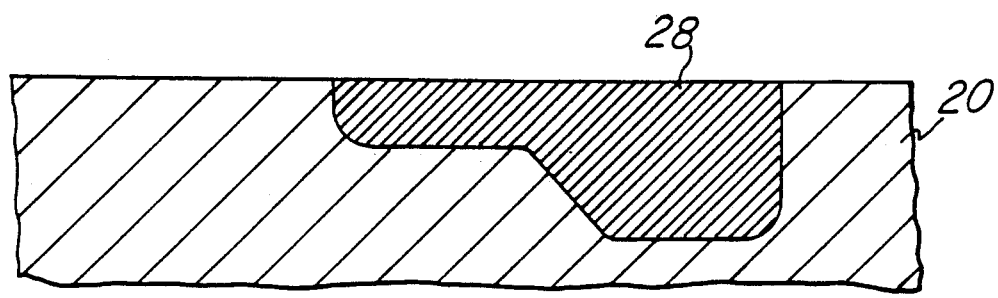

Referring now to FIG. 4b, a second ion implantation step is shown. Masking layer 40 is removed from the surface of substrate 20, and masking layer 41 is placed on the surface of substrate 20 in the position shown in FIG. 4b. A second ion implantation is performed using phosphorous ions, at a dose of 8E11 ions/cm$^2$, and at an energy of 150 keV. This increased dose and higher energy can also be provided by existing ion implantation equipment using methods well known in the art. Doped layer 46 results from this second ion implantation, and extends deeper into substrate 20 because of the higher implant energy. After the two phosphorous ion implant steps, a drive-in diffusion is done, which serves not only to anneal substrate 20 in order to repair damage to the crystal lattice structure caused by the implant, but also to cause the implanted phosphorous ions to diffuse to the desired depth, forming drain region 28. The drive-in diffusion may, of course, be at any temperature and time duration necessary to establish the proper junction depth; typical conditions are a temperature of 1000 degrees Celsius for 800 minutes. N-type drain region 28, shown in FIG. 4c, is thus defined.

Figure 4D:
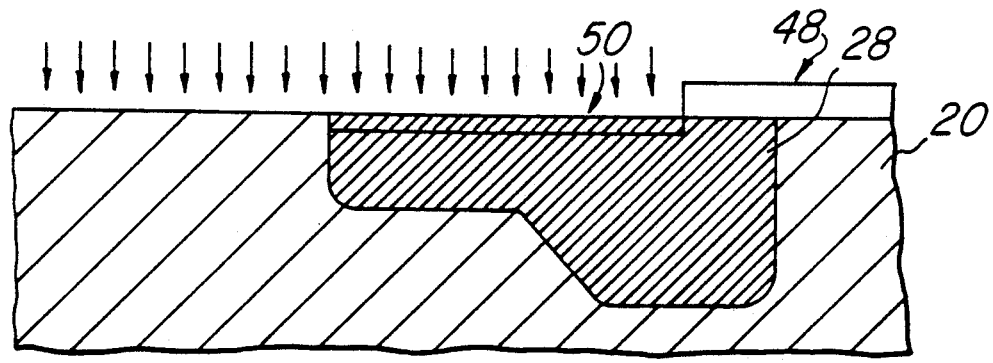
Figure 4E:
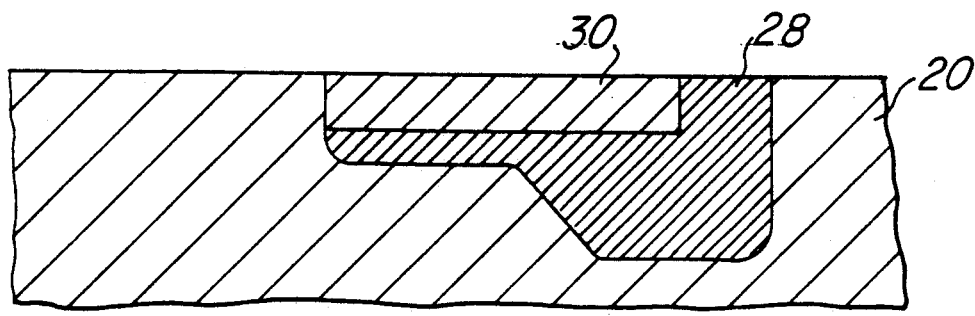

Referring now to FIG. 4d, the process for establishing channel region 30 will be described. Masking layer 48 is deposited similarly as described above, and substrate 20 is implanted with boron ions (boron being a p-type dopant) as indicated by the arrows in FIG. 4d. A typical dose is 1E13 ions/cm$^2$, at an energy of 50 keV. This implant step is sufficient to cause the implanted surface of substrate 20 to become p-type again, as indicated by doped layer 50. A drive-in diffusion at 900 degrees Celsius for 60 minutes is performed after the implant. It should be noted that this diffusion will also serve to further diffuse the phosphorous ions of drain region 28. After the drive-in diffusion for the implanted boron ions, channel region 30 is formed as shown in FIG. 4e.

Figure 4F:
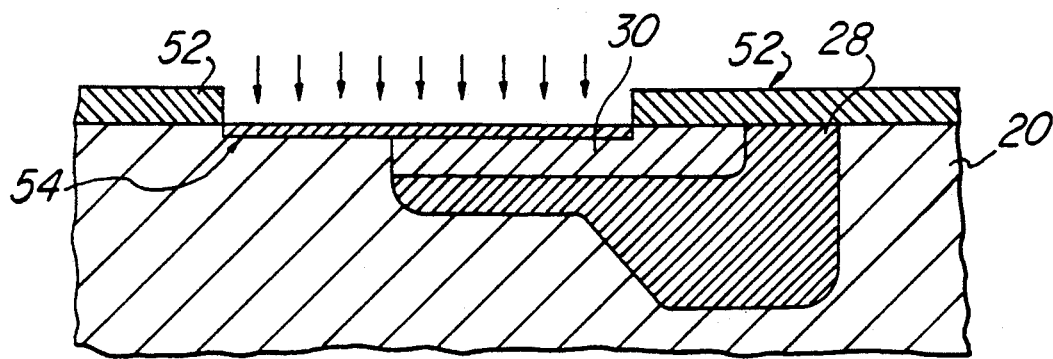
Figure 4G:
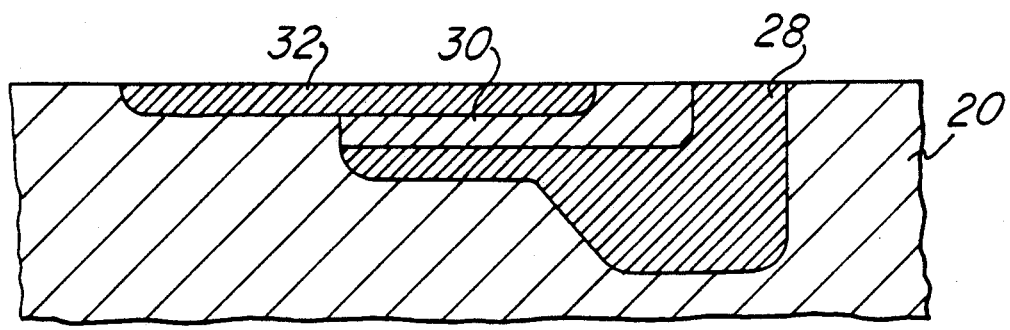

Source region 32 is next formed, referring to FIG. 4f. Masking layer 52 is placed on the surface of substrate 20 as discussed above, prior to the ion implantation. The implantation necessary to form source region 32 requires n-type dopants such as arsenic or phosphorous; in this embodiment, arsenic is the preferred dopant. A typical dose of arsenic ions is 8E15 ions/cm$^2$, at an energy of 150 keV. Doped layer 54, shown in FIG. 4f, results from this arsenic implant. As is evident from FIG. 4f, the implanted portions of substrate 20 become n-type again. Another drive-in diffusion is performed after the arsenic implant, typically at 900 degrees Celsius for 500 minutes. After this diffusion, source region 32 is formed as shown in FIG. 4g. Again, the arsenic drive-in diffusion also serves to further diffuse the phosphorous and boron ions previously implanted and diffused; however, the times and temperatures of all diffusion steps, as well as the implant doses and energies, are all designed with this taken into account.

Figure 4H:
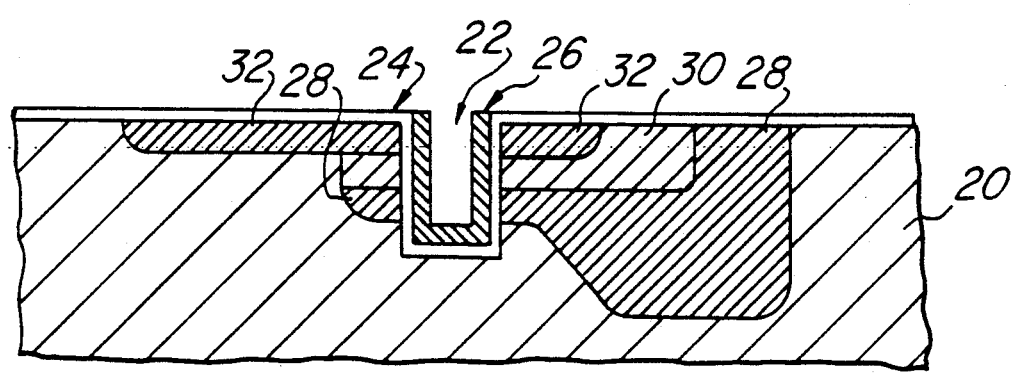

Referring now to FIG. 4h, the components of the gate of the transistor are shown added to the structure of FIG. 4g. Trench 22 is etched into the surface of substrate 20, intersecting source layer 32, channel layer 30 and drain layer 28, and extending in depth, measured from the surface of substrate 20, beyond drain region 28. The area of trench 22 is defined by photolithography techniques, similar to those explained above relative to the ion implantation steps, so that a protective masking layer covers the surface of substrate 20 except for the area at which trench 22 is to be etched. After the masking layer is in place, substrate 20 is etched, by methodes well known in the art, to create trench 22; the width and depth of trench 22 are on the order of 1 micron. In FIG. 4h, trench 22 is shown as having substantially vertical sidewalls; as will be explained below, trench 22 need not have vertical sidewalls for a transistor constructed according to the invention to properly operate and have the advantages of the invention, but the vertical sidewall construction is a more surface-area efficient construction, and provides the shortest channel length transistor. The masking layer for the etching of trench 22 is then removed, and substrate 20 is subjected to a high temperature environment so that silicon oxide is grown to form gate oxide 24; the growth of gate oxide 24 may be performed by any technique well known in the art to form a high quality oxide layer of approximately 100 angstroms in thickness. Of course, gate oxide 24 may be deposited rather than grown, but a grown oxide is generally preferred from an oxide quality standpoint. It should be noted that the oxide layer will also form on the top surface of substrate 20, over source region 32, channel region 30 and drain region 28, as shown in FIG. 4h. Subsequent to growth of gate oxide 24, a layer of polysilicon is deposited over the surface of substrate 20, and is patterned and etched by methods well known in the art to leave gate electrode 26 covering gate oxide 24 within trench 22, as shown in FIG. 4h.

By using the process parameters described hereinabove, a transistor having the features shown in FIG. 4h can be constructed, having a short channel length, and having the minimal capacitance features described earlier. The depth of source region 32 at trench 22 is approximately 0.25 micron using the process described above. Channel region 30 extends for approximately 0.25 micron below source region 32; the 0.25 micron channel length is well below the minimum channel length which can be reliably manufactured using current photolithographic techniques and equipment. Drain region 28, at trench 22, extends for an additional 0.30 micron below channel region 30, providing minimal gate-to-drain capacitance, as explained above. While the process described above results in a transistor having a channel length of 0.25 micron, current diffusion methods are capable of producing a transistor having a channel length as short as 0.15 micron.

Figure 5:
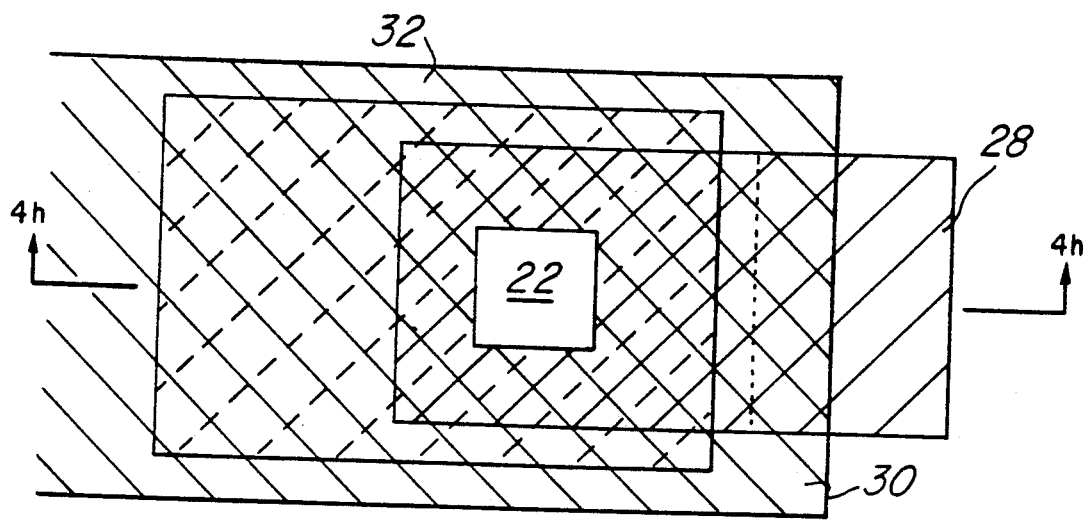
FIG. 5 is a plan view of the transistor of FIG. 2.

FIG. 5 is a plan view of the surface of substrate 20, after the construction of the transistor elements shown in FIG. 4h. The cross-hatching scheme of FIG. 5 differs from that of FIG. 4h for clarity. The areas shown in FIG. 5 are indicative of the areas of substrate 20 exposed by the appropriate masking layers in the formation of each of the implanted/diffused regions. For example, source region 32 shown in FIG. 5 is the area of the surface of substrate 20 which is exposed to the arsenic ion implantation illustrated in FIG. 4f. It should be noted that the dotted line within drain region 28 in FIG. 5 represents the boundary between the portion of drain region 28 receiving both the first and second phosphorous ion implantation (to the right of the dotted line) and the portion of drain region 28 receiving only the first phosphorous ion implantation (to the left of the dotted line).

Figure 6:
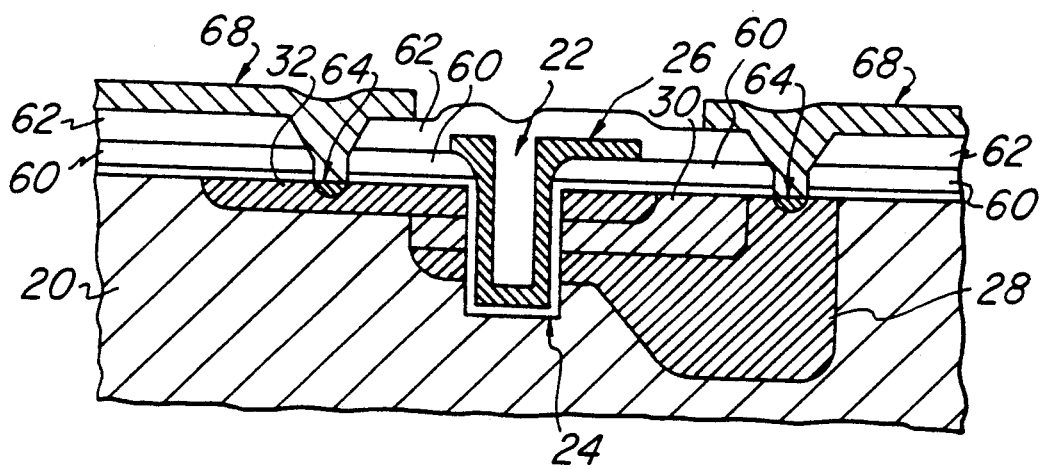
FIG. 6 is a cross-sectional view, showing electrical interconnections, of a transistor constructed according to the invention.

Subsequent to the construction of the basic elements of the transistor shown in FIGS. 4h and 5, electrical interconnection of drain region 28, source region 30, gate electrode 26, and possibly channel region 30, must necessarily be made. The fabrication techniques for making such interconnection are as varied as the applications for transistors in integrated circuits, many such arrangements being useful in connection with the transistor described herein. A simple example of such an interconnection arrangement is illustrated in FIG. 6. Isolation oxide layer 60 may be either grown or deposited at selected locations on the surface of substrate 20 prior to the growth of gate oxide 24, using techniques well known in the art. Isolation oxide layer 60 isolates the diffused regions from potential applied to gate electrode 26 and other interconnecting lines, because without sufficient oxide or other dielectric material under any extension of gate electrode 26 on the surface of substrate 20, the potential applied to gate electrode 26 may be sufficient to turn on parasitic transistors formed at the surface of substrate 20 by p-type regions disposed between two n-type regions. Such a parasitic transistor can be seen from FIGS. 4h and 5, to the right of trench 22, where channel region 30 extends to the surface; if gate electrode 26 were to extend to the right over this area, with only gate oxide 24 present between gate electrode 26 and the surface of substrate 20, channel region 30 at the surface of substrate 20 could become inverted with sufficient voltage applied to gate electrode 26. As shown in FIG. 6, polysilicon is deposited on top of oxide layer 60 and gate oxide 24, for forming gate electrode 26 and other conductive interconnections on substrate 20. The polysilicon layer is then patterned and etched to leave gate electrode 26 in the desired areas. Multilevel oxide layer 62 is then deposited to insulate gate electrode 26 from subsequent metallization interconnection lines. In order to make contact to drain region 28 and source region 32, contact vias are etched through multilevel oxide layer 62, isolation oxide layer 60 and gate oxide 24; diffusion of additional arsenic or phosphorous is then performed into source region 32 or drain region 28, as indicated by diffusion areas 64. N-type diffusion areas 64 more heavily dope source region 28 and drain region 32 to improve the ohmic contact between the subsequent metallization and said n-type regions. In order to make contact to source region 32 and drain region 28, metallization layer 68 (consisting of a metal such as aluminum) is deposited, patterned and etched to contact to source region 32 and drain region 28 at diffusion areas 64. Contact (not shown) will similarly be made to gate electrode 26 by metallization layer 68 through multilevel oxide 62. A protective passivation overcoat (not shown) may be deposited over the whole of the structure of FIG. 6 for protection from mechanical scratches, contaminants, and moisture. It should be noted that channel region 30 may also have its own contact at the surface, or may use a connection to the bottomside of substrate 20 for the application of a bias voltage. Other variations to the transistor structure shown in FIG. 6 obvious to those skilled in the art may be utilized for specific purposes or in specific manufacturing processes without departing from the spirit of the invention, including but not limited to double-level polysilicon layers, double-level metallization, and use of an epitaxial substrate.

Although the invention has been described in detail herein with reference its preferred embodiment, it is to be understood that this description is by way of example only, and is not to be construed in a limiting sense. It is to be further understood that numerous changes in the details of the embodiment of the invention, and additional embodiments of the invention, will be apparent to, and may be made by, persons of ordinary skill in the art without departing from the scope and spirit of the invention.

I claim:

1. A semiconductor insulated-gate field effect transistor, comprising:
   a semiconductor substrate of a first conductivity-type, said semiconductor substrate having a trench with substantially vertical sidewalls formed therein at a surface thereof;
   a first doped region disposed within said semiconductor substrate, said first doped region having a first bottom edge at a predetermined depth from said surface of said semiconductor substrate shallower than the depth of said trench, having a top edge at a predetermined depth from said surface of said semiconductor substrate, and having a lateral boundary extending to said trench, said first doped region being of a second conductivity-type, said second conductivity-type being an opposite conductivity-type from said first conductivity-type;
   a second doped region of said first conductivity-type disposed within said semiconductor substrate, said second doped region having a bottom edge adjacent to the top edge of said first doped region and having a top edge at a predetermined depth below the surface of said semiconductor substrate, said second doped region having a lateral boundary extending to said trench, said lateral boundary having an edge extending beyond the lateral boundary of said first doped region so that said second doped region contacts said semiconductor substrate;
   a third doped region of said second conductivity-type disposed within said semiconductor substrate, said third doped region having a bottom edge adjacent to the top edge of said second doped region, having a top edge at said surface of said semiconductor substrate, and having a lateral boundary extending to said trench and disposed on the top edge of said third doped region;
   a thin-film insulating layer disposed in said trench so as to contact said first, second and third doped regions along a wall of said trench;
   a conductive layer disposed adjacent to said thin-film insulating layer along said wall of said trench opposing said first, second and third doped regions;
   a first source-drain electrode connected to said first doped region;
   a second source-drain electrode connected to said third doped region; and
   a gate electrode connected to said conductive layer, wherein said gate electrode is separated from said top edge of said third doped region both by said thin-film insulating layer and by a layer of isolation oxide.

2. The transistor of claim 1, wherein said first doped region has, at a point within its lateral boundary away from said trench, a second bottom edge at a depth deeper than said predetermined depth of the first bottom edge of said first doped region;
   wherein said first doped region extends to the surface of said semiconductor substrate; and
   wherein said first source-drain electrode is connected to said first doped region at the surface of said semiconductor substrate and at a point above said second bottom edge.

3. The transistor of claim 2, further comprising a threshold control electrode connected to said second doped region.

4. The transistor of claim 1, further comprising a threshold control electrode connected to said second doped region.

5. An insulated gate transistor, comprising:
   a semiconductor layer of a second conductivity type containing a trench at a first surface, said trench having sidewalls substantially perpendicular to said first surface;

a first source/drain region within said layer, said first source/drain region doped a first conductivity type, and said first source/drain region located with a first portion of said sidewalls forming a part of the boundary of said first source/drain region;

said trench extending through said first source/drain region into said semiconductor layer;

a channel region within said layer, said channel region doped a second conductivity type opposite said first type, and said channel region located with a second portion of said sidewalls forming a part of the boundary of said channel region, said second portion abutting said first portion, and said channel region extending to said first surface away from said trench;

a second source/drain region within said layer, said second source/drain region doped said first type, and said second source/drain region located with a third portion of said sidewalls forming a part of the boundary of said second source/drain region, said third portion abutting said second portion, and said second source/drain region extending to said first surface;

a gate insulator on said sidewalls at said second portion; and a gate on said gate insulator.

6. The transistor of claim 5, wherein:
said semiconductor layer is p type silicon;
said first conductivity type is n type;
said gate insulator is silicon dioxide; and
said gate is polycrystalline silicon.

* * * * *